(12) United States Patent
Moukara (10) Patent No.: US 7,143,390 B2
(45) Date of Patent: Nov. 28, 2006

(54) METHOD FOR CREATING ALTERNATING PHASE MASKS

(75) Inventor: Molela Moukara, Munich (DE)

(73) Assignee: Infineon Technologies AG, Munich (DE)

( * ) Notice: Subject to any disclaimer, the term of this patent is extended or adjusted under 35 U.S.C. 154(b) by 275 days.

(21) Appl. No.: 10/881,703

(22) Filed: Jun. 30, 2004

(65) Prior Publication Data

US 2005/0028131 A1 Feb. 3, 2005

(30) Foreign Application Priority Data

Jun. 30, 2003 (DE) ................................ 103 30 467

(51) Int. Cl.
*G06F 17/50* (2006.01)
*G06F 19/00* (2006.01)
*G03F 1/00* (2006.01)

(52) U.S. Cl. .............................. 716/21; 430/5; 378/35; 700/120; 700/121

(58) Field of Classification Search .................. 716/21; 430/5; 378/35; 700/120, 121
See application file for complete search history.

(56) References Cited

U.S. PATENT DOCUMENTS

| 5,538,815 | A | * | 7/1996 | Oi et al. .......................... 430/5 |
| 5,576,126 | A | | 11/1996 | Rolfson |
| 6,680,151 | B1 | | 1/2004 | Heissmeier et al. |
| 6,730,463 | B1 | | 5/2004 | Heissmeier et al. |
| 2003/0140331 | A1 | | 7/2003 | Ludwig et al. |
| 2003/0203290 | A1 | * | 10/2003 | Misaka .......................... 430/5 |
| 2005/0008952 | A1 | * | 1/2005 | Dulman et al. ................. 430/5 |

FOREIGN PATENT DOCUMENTS

| DE | 100 57 437 A1 | 2/2002 |
| DE | 100 57 438 A1 | 2/2002 |
| DE | 101 29 202 C1 | 9/2002 |
| DE | 101 19 145 C1 | 11/2002 |

OTHER PUBLICATIONS

Socha et al., "Models for Characterizing Phase-Shift Defects in Optical Projection Printing", IEEE Transactions on Semiconductor Manufacturing, vol. 8, No. 2, May 1995, pp. 139-149.*

* cited by examiner

*Primary Examiner*—Phallaka Kik
(74) *Attorney, Agent, or Firm*—Slater & Matsil, L.L.P.

(57) ABSTRACT

A method is provided for creating a phase mask for lithographic exposure operations. In this case, phase-shifting regions (10) with a different phase are defined on both sides of critical structures (6), which fall below an extent limit. At least one phase shifter correction is carried out such that at least two mutually facing phase-shifting regions (10) are joined together to form a contiguous phase-shifting region (10) if their distance from one another falls below a predetermined minimum distance.

25 Claims, 10 Drawing Sheets

METHOD FOR CREATING ALTERNATING PHASE MASKS

This application claims priority to German Patent Application 103 30 467.3, which was filed Jun. 30, 2003 and is incorporated herein by reference.

TECHNICAL FIELD

The invention relates generally to masks and more particularly to a method for creating phase masks for photolithographic exposure.

BACKGROUND

Structures that are applied to a substrate by means of lithography technology during the production of integrated semiconductor circuits have to be made smaller and smaller. A technologically limiting factor in this case is the wavelength of the light used during the lithography. On account of diffraction effects, the resolution of a conventional imaging system is limited and structures having dimensions below the reciprocal value of said resolution, the so-called critical structures, are blurred or imaged unsharply. This can lead to impairments of the circuit.

These difficulties can be overcome by utilizing the destructive interference effect of two closely adjacent and coherent light beams with phases shifted approximately through 180°. Use is made of so-called alternating phase masks, in which each critical structure is alternately provided with two phase-shifting regions that are assigned a different phase shifted through about 180°. A destructive interference effect thereby arises on the substrate to be patterned, for example a semiconductor circuit, said destructive interference effect enabling the formation of the critical structures.

In this case, a distinction is made between dark field technology, in which the transparent structures correspond to the circuit elements (e.g., the interconnects) and nontransparent mask fields are formed by zones covered with chromium, for example, and bright field technology, in which the nontransparent structures correspond to the circuit elements (e.g., the interconnects) and the transparent mask fields form the free zones.

Since modern circuits such as VLSI and ULSI circuits are becoming ever more complex and the critical structures assume very complicated geometrical forms, the phase allocation with only two different phase-shifting regions is complicated. Conflict regions (also called phase conflicts) may occur at critical structures, and, during the lithography operation, cause imaging errors on the substrate to be patterned. In the case of phase conflicts, a mask region is not assigned the required phase difference. This is the case if a critical structure has incorrectly been allocated the same phase on both sides, which leads to irreparable damage to the semiconductor circuit during the exposure operation. On the other hand, however, conflict regions may also occur if a destructive interference effect occurs at an undesirable location of the semiconductor circuit on account of the interaction of the phase-shifting elements.

The phase allocation for the different phase-shifting elements represents a mathematical-combinatorial problem, which is not generally solvable. Since the phase allocation can, in principle, lead to different results, the phase allocation has to be finally performed on the finished circuit layout in an automated program.

Published German Patent Application 100 57 438 discloses a method for checking the imagability of an alternating bright field phase mask by examining the phase mask for conflict centers of phase conflicts and localizing them. Published German Patent Application 100 57 437 discloses an analogous method for dark field technology. A conflict center is an inner contour of a contiguous region comprising critical structures and phase-shifting regions, adjoined by an odd number of critical structures. At such a conflict center, a phase-conflict-free phase allocation for the phase-shifting regions is not possible combinatorially, that is to say a phase conflict cannot be avoided. U.S. Patent Application Publication 2003/0140331, which is incorporated herein by reference, claims priority to the two above-mentioned German patent applications.

These two documents explain that phase conflicts that have occurred can be circumvented in two different ways. Firstly, the circuit layout can be altered slightly, for example by shifting the interconnect structures, thereby eliminating the phase conflicts. On the basis of this altered circuit layout, it is then possible to carry out a renewed phase allocation for the creation of the phase mask. Secondly, phase-shifting regions can be allocated two different phases. However, the consequence of this is that, at the boundary line between the two different phase zones, a dark line occurs during exposure, which would lead to an interruption of the circuit. These dark lines must thereupon be corrected.

The problem with these methods is that the circuit layout is to be altered only to a very limited degree, since the functioning of the circuit must not be altered. On the other hand, correcting the phase conflicts is time-consuming, since all of the phase conflicts have to be treated individually.

SUMMARY OF THE INVENTION

In one aspect, the invention provides a method for creating phase masks in which imaging errors are avoided.

According to a preferred embodiment, in order to create a phase mask for lithographic exposure operations, phase-shifting regions with a different phase are defined on both sides of critical structures, which fall below an extent limit. The solution according to the preferred embodiment is distinguished by the fact that at least one phase shifter correction is carried out such that at least two mutually facing phase-shifting regions are joined together to form a contiguous phase-shifting region if their distance from one another falls below a predetermined minimum distance.

By way of example, if two phase-shifting regions, which lie close together at narrow so-called interaction regions, are joined together, then the intervening interaction region is removed and a possible imaging error is avoided at this location. The narrow interaction regions are narrow regions of the phase mask, which have phase-shifting regions on both sides arranged close to one another. If a different phase is assigned to the phase-shifting regions on the two sides of the interaction region, then an undesirable destructive interference arises at the interaction region. If the two phase-shifting regions are joined together in the manner provided according to the invention, then they form a single, contiguous phase shifting region and an undesirable interaction no longer occurs during an exposure of the phase mask.

The joining together of phase-shifting regions represents a phase shifter correction, that is to say an alteration of the phase-shifting regions. Thus, unlike what is proposed in the prior art, there is no complex altering of the circuit layout, which is complicated to realize since the circuit functions must not be altered, rather the phase-shifting regions are corrected. This simplifies the creation of the phase mask.

The method according to embodiments of the invention reduces the number of conflict regions, which reduces the number of changes to be performed after an exposure operation. This optimizes and shortens the process for producing semiconductor circuits that are to be produced with the phase mask, by way of example.

In an advantageous manner, after at least one phase shifter correction has been carried out, the phase mask is checked for the presence of conflict centers, inner contours of contiguous regions, which inner contours are adjoined externally exclusively by phase shifting regions and an odd number of contact sections with critical structures, being interpreted as conflict centers. Contiguous regions thus comprise critical structures and phase-shifting regions. Conflict centers are adjoined externally by an odd number of critical structures. Afterward, at least one of the conflict centers present is eliminated by at least one phase-shifting region that adjoins the conflict center being separated into two phase-shifting regions with a different phase.

Once phase shifter corrections have been performed, the phase mask is examined on conflict centers, as has been described in the introduction in the prior art. A phase-conflict-free phase assignment of the phase shifting regions is not possible combinatorially at a conflict center.

If the check reveals that the phase mask has no conflict centers, then a phase assignment is effected for the phase-shifting regions and the phase mask can be created and used for an error-free lithography operation.

If at least one conflict center is present, a phase-shifting region adjoining the conflict center is separated into two phase-shifting regions with a different phase, which enables a phase allocation at the conflict center.

One advantage of various embodiments of the invention is that these corrections can be automated. By way of example, it is possible to provide corresponding software that automatically performs the corresponding sequences.

In contrast to the solution approaches known heretofore, it is not necessary, for example, to alter the complex construction of the line structures that are to be created by means of an exposure operation of the mask structure.

Phase conflicts generally arise at the separations performed, which phase conflicts still have to be corrected. In the case of the method according to the invention, the separation locations at unavoidable conflict centers may be chosen such that no phase conflicts arise in so-called forbidden zones, but rather are displaced into subsequently correctable regions of the mask structure, which constitutes a major advantage.

The method according to the invention is a so-called RET (resolution enhancement technique) and can be used, in particular, also in lithography methods with exposure wavelengths of approximately 193 nm.

In an advantageous manner, after a combination of at least two phase-shifting regions or a separation of at least one phase-shifting region, the phases are assigned for the remaining phase-shifting regions in such a way as to maximize the number of phase-shifting regions with a different phase in each case on both sides of a critical structure. The new assignment of the phases is of a complex nature on account of the ambiguity of the possible phase allocation. Since critical structures are intended to be imaged in dark fashion during the exposure operation, as far as possible all of the critical structures have to be surrounded with alternating phase-shifting regions. However, since this assignment is not possible in every layout case of the semiconductor circuit, phase-shifting regions are separated and assigned new phases.

In an advantageous manner, during the separation of at least one phase-shifting region, the phase-shifting regions that are newly formed are either
  arranged in a manner adjoining one another; or
  are arranged spaced apart, the intermediate region being covered with a light-opaque material, in particular chromium, or the intermediate region being assigned an intermediate phase.

The use of an intermediate phase makes it possible to correct the dark lines that have arisen along the separation and thereby to correct an error on the substrate that is to be subjected to lithography. An intermediate phase is a phase-shifting region which is assigned a phase that differs from the two phases used with a phase difference of 180°. By way of example, if the first phase is 0° and the second phase is 180°, then e.g., 90° may be used as the intermediate phase. As a result, the destructive interference effect is greatly suppressed along the separation during an exposure operation of the phase mask.

The use of intermediate phases is technically complex to realize. Therefore, the phase mask created according to the invention has the advantage that the number of intermediate phases to be used is reduced and the creation of the phase mask is thereby simplified.

In an advantageous manner, at least one phase shifter correction is carried out in order that
  an interaction region is avoided by merging at least two phase-shifting regions; and/or
  predetermined phase mask boundary conditions are implemented; and/or
  a corner of at least one phase-shifting region is made possible which has an angle other than 0°, 45°, or 90° with respect to the phase mask main direction, at which the phase mask is oriented; and/or
  holes in the phase mask which cannot be realized or can only be realized in a complicated manner are prevented; and/or
  phase-shifting regions at ends of critical structures are modified or adapted in order to eliminate shortening effects at ends of critical structures.

The merging of two phase-shifting regions across an interaction region prevents a phase conflict at the interaction region if the phase-shifting regions have been assigned a different phase.

Phase mask boundary conditions are, by way of example, a minimum extent limit of the phase-shifting regions or distances between phase-shifting regions.

Shortening effects often occur at ends of critical structures. Therefore, at these locations, the adjoining phase-shifting regions are lengthened, for example, beyond the end of the critical structure in order to avoid a shortening.

In a phase mask, it has been necessary hitherto only to realize angles at 0°, 45° or 90° with respect to a phase mask main direction to be chosen as desired. If phase-shifting regions are intended to have an angle that deviates therefrom, it is possible to carry out phase shifter corrections there in order to enable other angles and to eliminate imaging errors.

If free regions (also called holes) that cannot be imaged correctly during an exposure occur in the phase mask, then it is possible to carry out phase corrections in order to close these holes with phase shifting regions by merging adjoining phase-shifting regions with one another.

The phase shifter corrections are carried out prior to checking for conflict centers.

In all of the phase shifter corrections, at least two mutually facing phase-shifting regions are combined across a distance to form a contiguous phase-shifting region.

Preferably, the separation is effected along a connecting path between at least two conflict centers that lead to lithography errors during an exposure operation. As a result, by means of a separation, two conflict centers become regions that can be imaged in a manner free of errors, while there arises along the separation path a so-called interaction region, which, during the lithography operation, leads to an imaging error on the semiconductor circuit on account of destructive interference. A region on the phase mask that leads to such an imaging error likewise represents a phase conflict.

In an advantageous manner, the separation is effected along a connecting path between at least one conflict center and a contour—remote from the conflict center—of the contiguous region comprising critical structures and phase-shifting regions, said contiguous region adjoining the conflict center. By means of the separation of a phase-shifting region that is adjacent to a conflict center, it is possible, directly beside a conflict center to effect a new assignment of the phases of the surrounding phase-shifting regions and to displace an adjoining conflict region.

In an advantageous manner, the phase mask is created by a computer program containing a generation program for the phase-shifting regions. The above-described corrections of the phase mask can be carried out by means of a generation program, which makes the method automatable. Since a single phase mask can have thousands of conflict regions, manual correction of the phase mask is very time-consuming. A corresponding generation program substantially simplifies the method.

In an advantageous manner, before phase shifter corrections are carried out, on both sides of critical structures, phase-shifting regions of constant width are defined, the constant width having been determined beforehand by an optical simulation program. Thus, a phase mask is generated whose phase-shifting regions have not yet been assigned a phase and on the basis of which phase shifter corrections are performed. The width of the phase-shifting regions, which is assigned to the critical structures for the purpose of creating a provisional phase mask, is usually constant. If a wavelength of 193 nm is used during the lithography operation, then a width of between 170 and 200 nm is appropriate for the phase-shifting regions. The phase-shifting regions on the one hand have to be wide enough to assign the necessary phase to the light on both sides of the critical structure during the exposure operation; on the other hand, they are to be as small as possible in order not to take up too much space on the phase mask and thus to generate phase conflicts as little as possible by virtue of interaction regions with other phase-shifting regions arising.

Preferably, the separation of at least one phase-shifting region is effected such that a maximum number of zones—called forbidden zones hereinafter—containing important circuit functionalities do not correlate with conflict regions. Imaging errors which have a particularly serious influence on the method of operation of the semiconductor circuit are thereby avoided during the lithography operation. The combinatorial selection of the separation at a conflict center makes it possible to shift conflict regions out of forbidden zones.

In an advantageous manner, a bright field or dark field phase mask is created as the phase mask. The method of operation of the method described applies both to bright field technology and to dark field technology. Equally, the phase mask may be a chromiumless phase mask.

Preferably, the phase-shifting regions used have precisely two different phases, in particular two phases shifted through 180° relative to one another.

In an advantageous manner, the separation is effected along a connecting path, which is determined by at least one stencil element from a previously defined set of stencil elements with connecting paths for predetermined layout stipulations. In this case, a stencil element is not an actual stencil but rather a possible known connecting path between two regions, which correspond to an already known layout. The set of stencil elements has to be pregenerated such that as far as possible all conflict centers that occur can be assigned a connecting path. The connecting path, prescribed by the suitable stencil element or elements, is created on the phase mask and an opposing phase is assigned to the adjoining phase-shifting regions. The selection of the suitable stencil elements represents a mathematical-combinatorial problem, which is advantageously solved by a computation routine.

Preferably, prior to selection of the stencil element or stencil elements to be used, the stencil elements from the previously defined set of stencil elements that lie in or at a forbidden zone are rejected. The connecting paths are usually not to be assigned unambiguously in a given layout of a semiconductor circuit.

In an advantageous manner, a plurality of phase shifter corrections are carried out, during which phase-shifting regions are joined together such that all the interaction regions present on the phase mask are removed.

In an advantageous manner, the phase shifter corrections performed are used as stencil elements. Thus, the selection of a stencil element reverses a previously performed phase shifter correction.

In an advantageous manner, a phase mask created according to the invention is used for effecting lithography, undesirable imperfections that have arisen after an exposure operation, carried out with the phase mask produced, on a substrate to be patterned, in particular a semiconductor circuit, being subjected to further treatment with trimming masks.

BRIEF DESCRIPTION OF THE DRAWINGS

The invention is explained in more detail below using a plurality of exemplary embodiments with reference to the figures of the drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
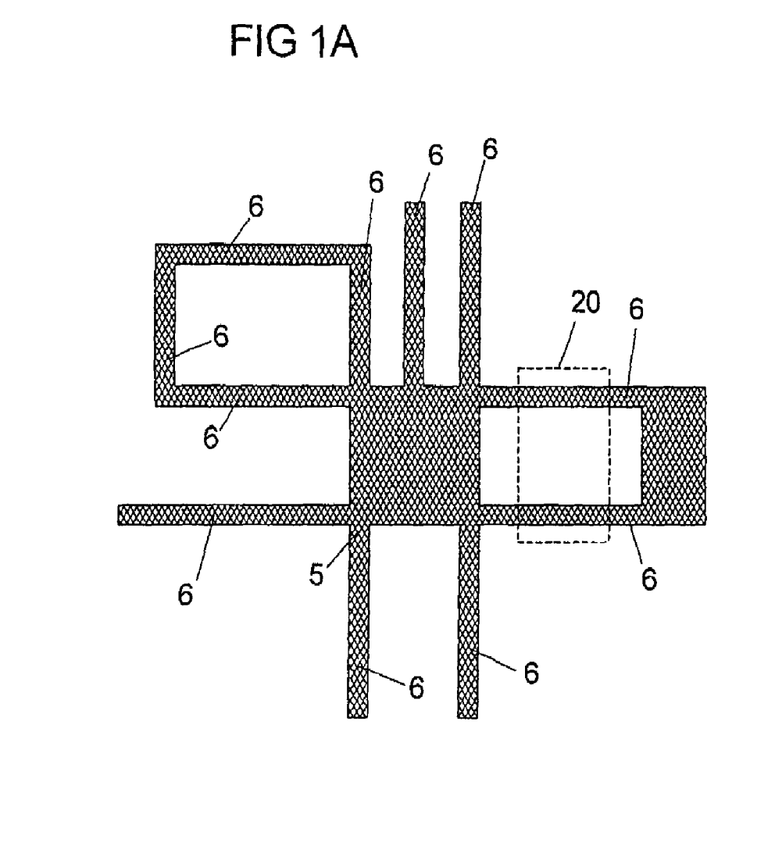
FIGS. 1A–1E show a schematic illustration of the layout of a semiconductor circuit with associated phase masks in bright field technology.

FIG. 1A shows a schematic illustration of a layout of a semiconductor circuit as semiconductor circuit element. Dark conductor structures 5 on the phase mask correspond to the circuit elements of the semiconductor circuit that are to be subjected to lithography. In bright field technology, the line structures 5 in the phase mask are formed by nontransparent material (for example, chromium). The narrow line structures 5 represent critical regions 6 (also called critical structures). Given a wavelength of 193 nm for the exposure operation for effecting lithography, the smallest structures have a width of 100 nm, that is to say well below the wavelength used. The wider dark line structures 5 illustrated can be imaged without lithography errors.

A rectangle depicted by dashed lines identifies a forbidden zone 20, which represents a particularly important component part of the semiconductor circuit. Such forbidden zones are, by way of example, active gate regions that determine switching times and limiting frequencies, and have to be subjected to lithography as exactly as possible.

Figure 1B:
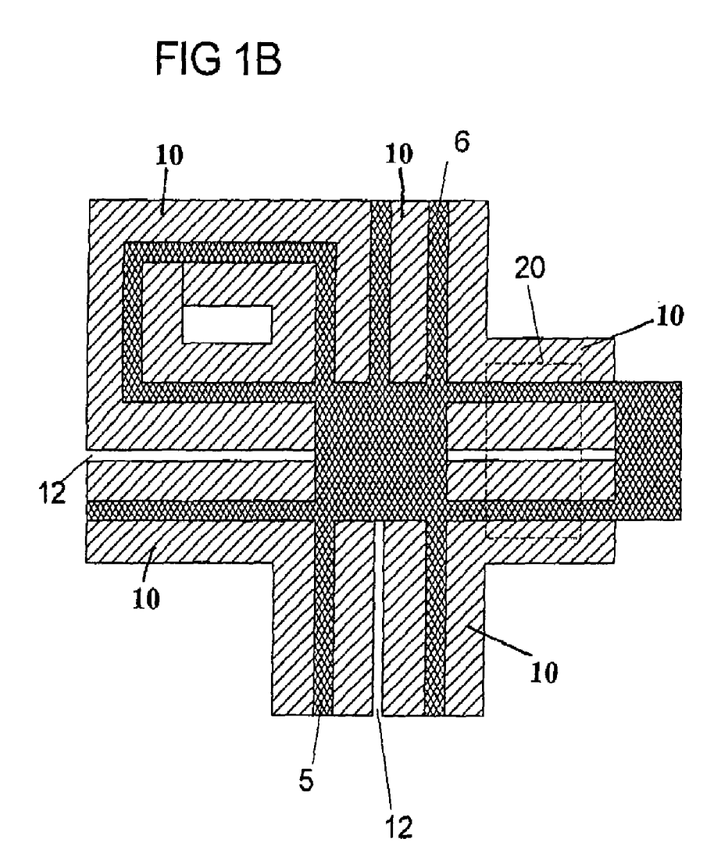

FIG. 1B shows how respective phase-shifting regions 10 are created (illustrated in hatched fashion) on both sides of the critical structures 6 of the line structures 5. In the case of critical structures having a width of about 100 nm, said phase-shifting regions uniformly have a width of about 185 nm. However, it is also possible to use phase-shifting regions with a different width. If phase-shifting regions 10 overlap in this case, then they are combined to form one phase-shifting region 10.

The phase-shifting regions 10 are generated automatically by a generation program during the creation of the phase mask. The optimum width of the phase-shifting regions 10 to be used is determined by an optical simulation program, which forwards the optimum width to the generation program. Narrow interaction regions 12 often arise between the phase shifting regions 10 during generation. These interaction regions 12 remain free in the phase mask, but, on account of the close arrangement to two phase-shifting regions 10, interactions may arise in the interaction regions 12 if the two adjoining phase-shifting regions have a phase shifted through 180° relative to one another.

Figure 1C:
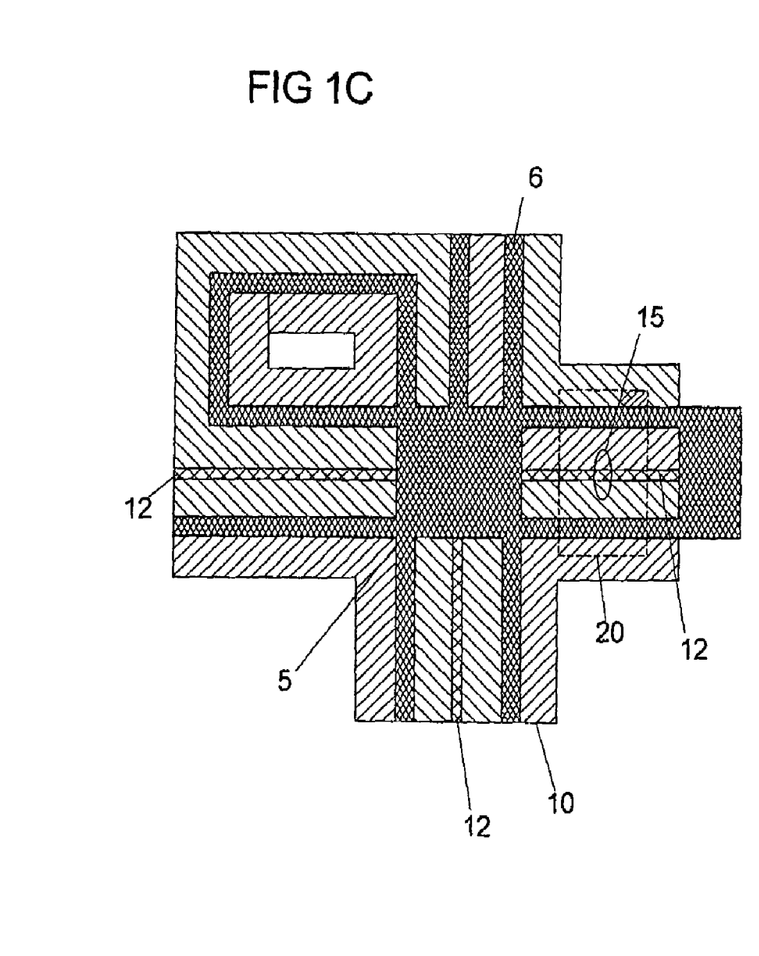

The phase-shifting regions 10 are formed in alternating fashion in FIG. 1C. This means that generated phase-shifting regions 10 are arranged on both sides of the critical structures 6, which regions have the two different phases with the phase difference of 180° and are accordingly identified by two different hatchings. The automatically created phase-shifting regions 10 on both sides of the critical structures in each case have a different phase in order that, during the exposure operation for effecting lithography, no phase conflicts arise on account of an interaction between the beams on the two sides of the critical structures. According to the preferred embodiment of the invention, the assignment of the phases is not yet necessary at this point, but rather has been performed only in order to assist understanding.

Regions of the phase mask which lead to imaging errors during the lithography operation are called conflict region or else phase conflict. If the phase-shifting regions have a phase that is offset by 180° with respect to the two phase-shifting regions 10 that are closely (or critically) near to one another, then a destructive interference occurs during the exposure operation within the critical structure on the semiconductor circuit if beams are diffracted onto the circuit element. As a result, the critical conductor structures effectively remain "unexposed" during the exposure operation, as is desired in bright field technology.

Double hatching identifies the narrow interaction regions 12 between two phase-shifting regions 10 here. In this example, the interaction regions 12 have an elongated, rectangular form with two long and two short outer sides. A phase-shifting region 10 is provided in each case at the two long outer sides; in the example shown, either a line structure 5 or a free region is provided at the shorter outer sides. If the phase-shifting regions 10 provided at the two long outer sides of an interaction region 12 have the same phase, then correct imaging is effected during the exposure operation for effecting lithography.

In a loop of the line structures 5, the phase mask has an interaction region 12. On account of the ambiguity of the phase allocation, this may lead to destructive interferences at undesirable layout locations if phase-shifting regions 10 with a different phase are provided at the long outer sides of the interaction region 12. In bright field technology, this means that an etching beam does not fall onto the integrated semiconductor circuit at these locations and, as a result, lithography is not effected as desired at these locations.

A phase conflict 15 arises within the forbidden zone 20, which phase conflict can cause a particularly critical effect on the functioning of the semiconductor circuit.

Figure 1D:
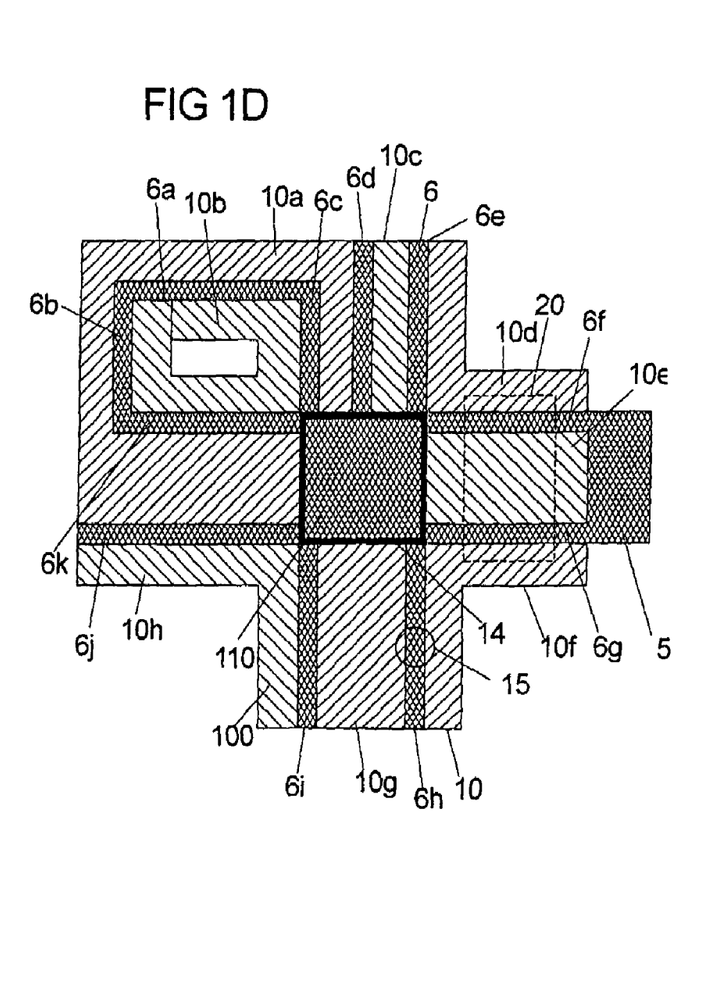

FIG. 1D shows the phase mask in which, in order to eliminate the ambiguity of the phase allocation in FIG. 1C, the phase-shifting regions 10 are joined together across the interaction regions 12. Therefore, the phase mask no longer has interaction regions 12.

The phases of some phase-shifting regions 10 have been adapted and rearranged on account of the merging. In this case, the phase respectively offset by 180° is as far as possible allocated to the phase-shifting regions 10 on both sides of a critical structure. This represents a combinatorial problem, which does not always work out. In this case, so-called classical phase conflicts 15 may arise; such a phase conflict 15 is identified by a circle in FIG. 1D. In the case of classical phase conflicts, the phase-shifting regions 10 have the same phase on the two closely adjacent sides of the critical structures. This may lead to imaging errors on account of an interaction (cf. FIG. 2A).

In contrast to FIG. 1C, the phase mask no longer has a phase conflict within the forbidden zone 20.

Next, the phase mask present is checked for conflict centers. In this case, the method described in the document mentioned in the introduction may be used, according to which inner contours of contiguous regions of critical structures 6 and phase-shifting regions 10 are examined to determine whether they have an odd number of contact sections with critical structures. Such a conflict center 14 is illustrated by a crosshatched polygon in FIG. 1D. The polygon has nine (that is to say an odd number) contact sections with critical structures 6. Therefore, it is not possible combinatorially to assign the phases in a manner free of conflicts around the conflict center. Thus, in the example in accordance with FIG. 1D, the contiguous region is formed by the individual regions 6a, 6b, 6c, 6d, 6e, 6f, 6g, 6h, 6i, 6j and 6k—that is to say the critical structures—and the individual regions 10a, 10b, 10c, 10d, 10e, 10f, 10g and 10h—that is to say the phase-shifting regions. The contiguous region 100 thus surrounds the central region 110—hatched in the figure—whose outer contour corresponds to the inner contour of the contiguous region 100.

Figure 1E:
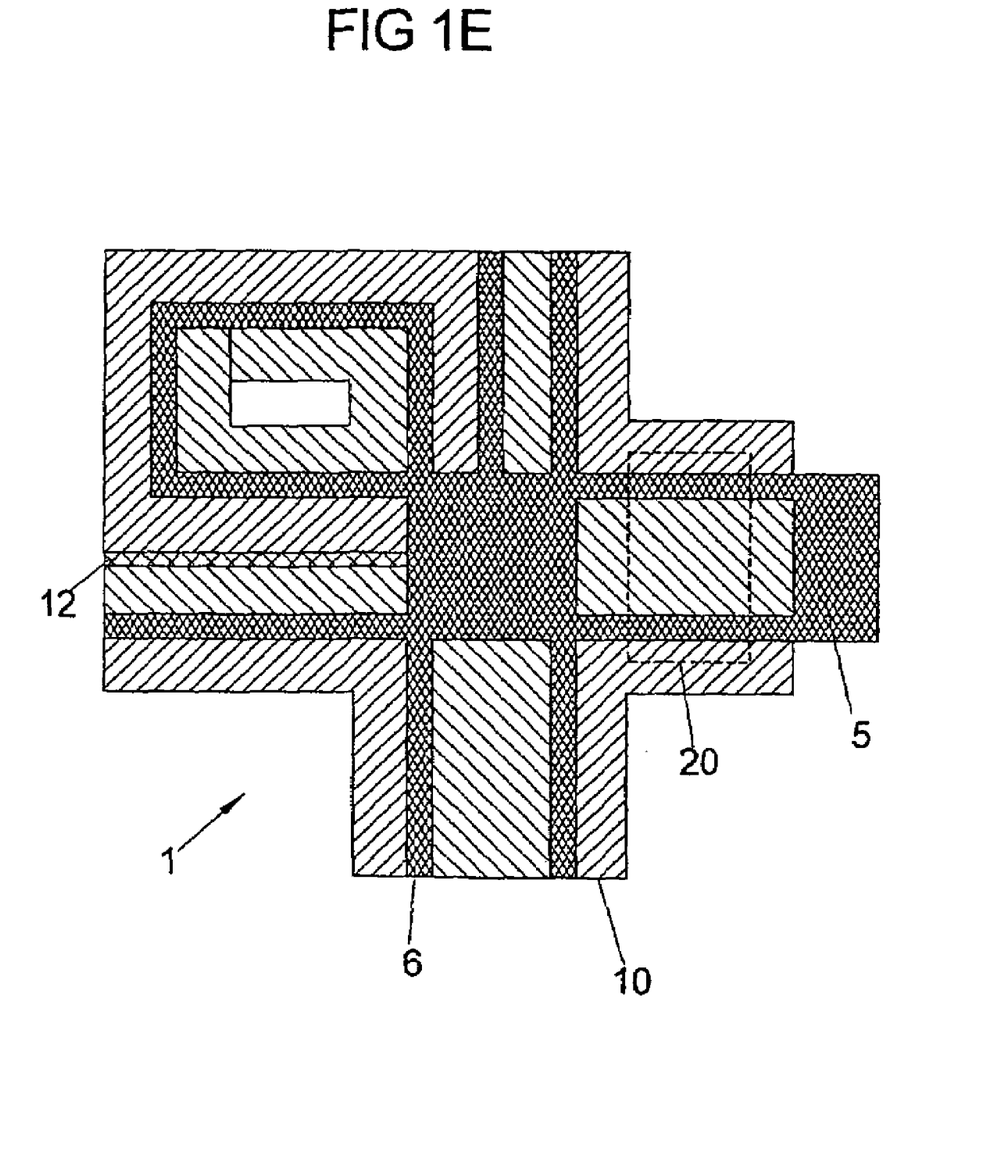

FIG. 1E shows the phase mask 1 representing a further development of the phase mask from FIG. 1D. A phase-shifting region 10, which does not interact with the forbidden zone 20 and adjoins the conflict region, has been separated. The separation is effected such that each conflict center 14 is connected to precisely one other conflict center 14 or to the outer contour of a composite region comprising phase-shifting regions 10 and critical structures 6. One of the previously performed phase shifter corrections has thus been reversed. The connecting path illustrated in FIG. 1E represents an interaction region 12. Therefore, in contrast to FIG. 1D, FIG. 1E has an interaction region 12 illustrated in double-hatched fashion. The phase-shifting regions 10 are then assigned their final phases, so that classical phase conflicts no longer occur.

The two different phases may be realized during the production of the phase mask on a glass plate, for example, by the glass thickness of the phase-shifting regions differing such that the light used in the lithography operation, after radiating through the phase-shifting regions, has a phase shifted through 180°. In order to avoid an imaging error, a so-called intermediate phase may be applied to the phase mask along the interaction region 12. As a result, the phase mask has a different glass thickness there than in the case of the other two phase-shifting regions used. The use of an intermediate phase prevents the occurrence of errors on the semiconductor circuit to be subjected to lithography. Producing an intermediate phase on the phase mask is very complex in terms of production engineering. Therefore, the production of the phase mask of FIG. 1E is substantially simpler than, for example, the production of the phase mask 1C with corresponding intermediate phases at the interaction regions 12.

This phase mask 1 is used for an exposure operation during the production of semiconductor circuits. In this case, a dark line may arise on the semiconductor circuit along the interaction region 12. If no intermediate phases have been used, said dark line has to be subjected to further treatment with trimming masks. However, the use of trimming masks is also technically very complex, since the alignment of the trimming mask for a post-exposure is very complicated. Dark lines can be subjected to aftertreatment during subsequent exposure steps, while erroneously exposed regions of the semiconductor circuit can no longer be corrected. The procedure explained prevents conflict regions of the phase mask, which, during the exposure operation, cause the exposure of locations of the semiconductor circuit which are intended to remain unexposed. Imaging errors in the case of which dark lines remain occur exclusively, which can be corrected by subsequent exposures.

Figure 2A:
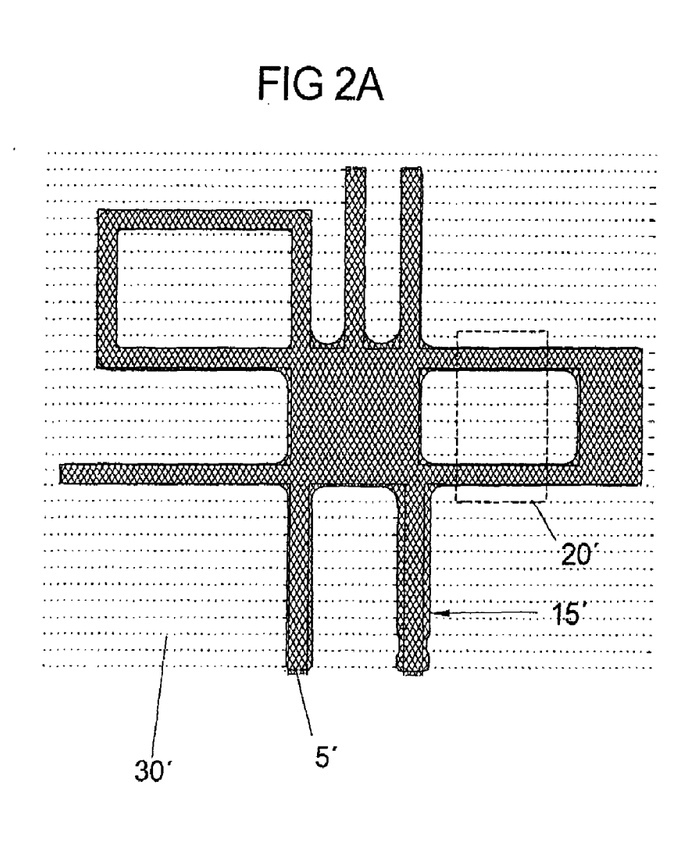
FIGS. 2A and 2B show simulations of the semiconductor circuit after an exposure operation with phase masks of FIGS. 1D and 1E.

FIG. 2A shows an aerial image simulation of a semiconductor circuit after an exposure operation with the phase mask from FIG. 1D. In this case, the exposed and thus etched regions 30' are shown light. The border contours of the envisaged circuit elements shown in FIG. 1A are identified by a line, as is the forbidden zone 20'. The actual form of the circuit elements 5' was determined by a simulation and is shown gray.

The border contours have been rounded by virtue of diffraction effects during the exposure operation. An arrow identifies the imaging error 15', corresponding to the phase conflict 15 from FIG. 1D. The circuit element 5' is significantly widened here.

Figure 2B:
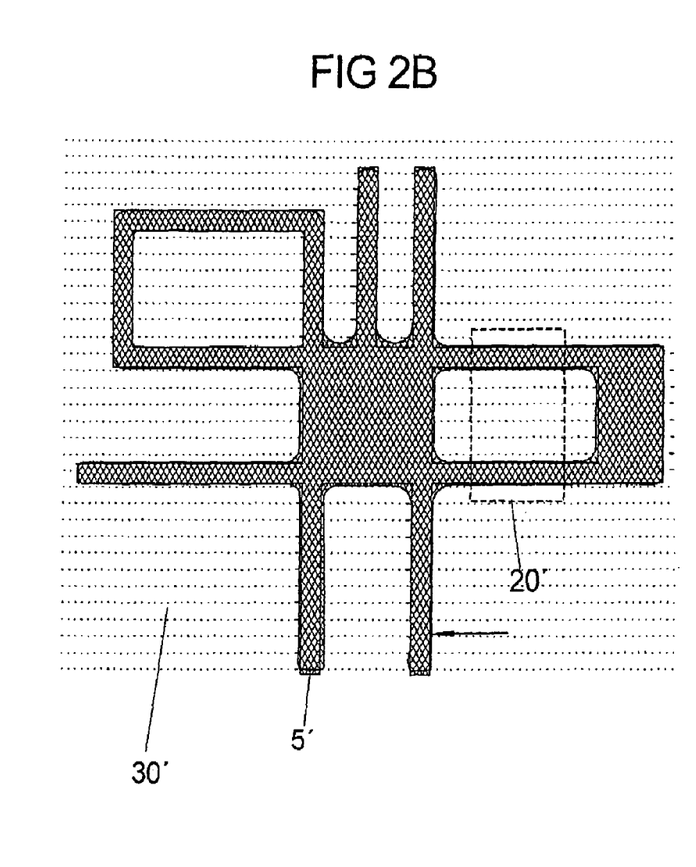

FIG. 2B illustrates the simulation of the semiconductor circuit after an exposure operation with the phase mask 1 from FIG. 1E. An arrow points to the location of the circuit element 5' which had been widened after the exposure by means of the phase mask of FIG. 1D. The exposure operation of the phase mask 1 from FIG. 1E images the critical structure with the envisaged width.

Figure 3A:
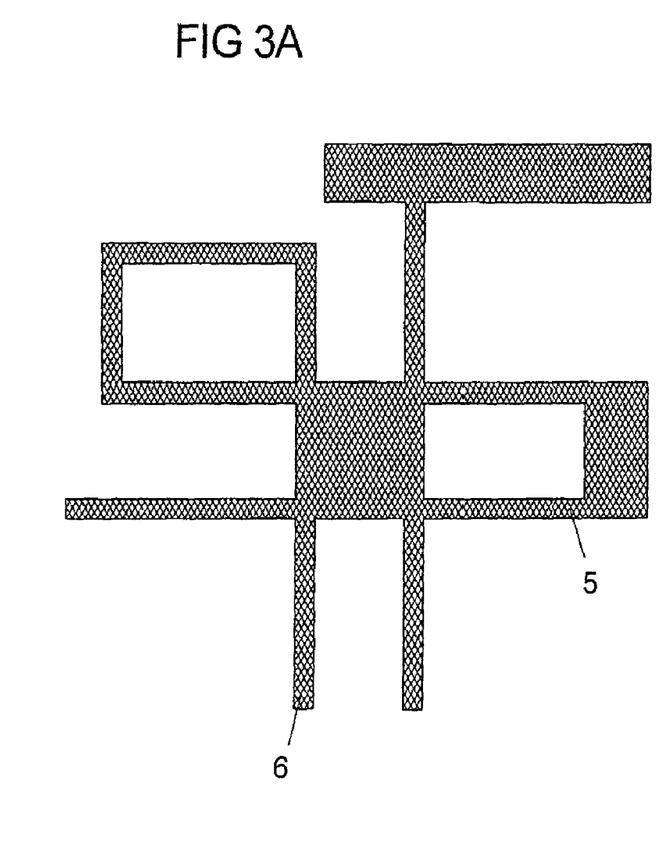
FIGS. 3A–3D show a schematic illustration of the layout of a second semiconductor circuit with associated phase masks in bright field technology.

FIG. 3A shows a schematic illustration of a further example of a layout of a semiconductor circuit as semiconductor circuit element. The circuit elements of the semiconductor circuit that are to be represented are shown dark. The line structures 5, which are made smaller than a critical resolution limit, represent critical structures.

Figure 3B:
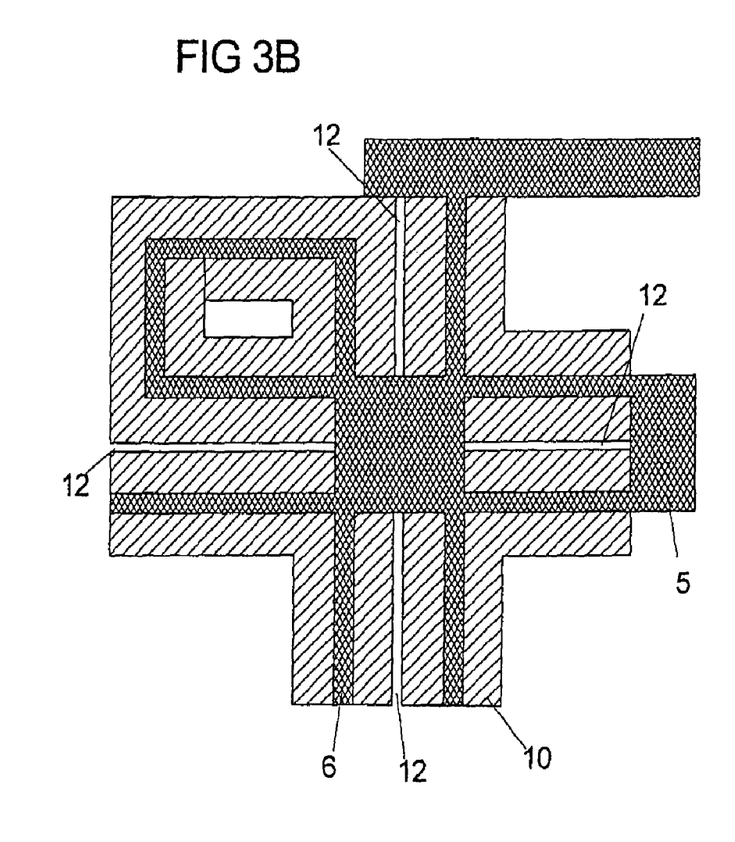

FIG. 3B shows how respective phase-shifting regions 10 are created (illustrated in hatched fashion) on both sides of the critical structures of the line structures 5, four narrow interaction regions 12 arising between the phase-shifting regions 10.

Figure 3C:
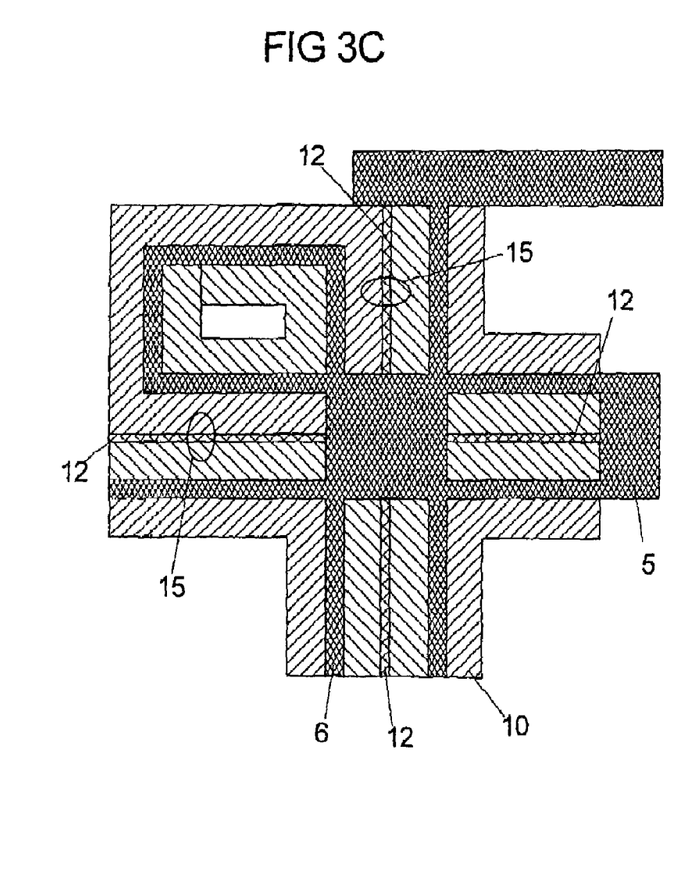

In FIG. 3C, the phase-shifting regions 10 are formed in alternating fashion. Generated phase-shifting regions 10 are illustrated on both sides of the critical structures 6, which regions have the two different phases with the phase difference of 180° and are accordingly identified by two different hatchings. In this case, the phase-shifting regions 10 are arranged such that phase-shifting regions 10 of the same phase are arranged on both sides of two of the four narrow interaction regions 12 (illustrated by double hatching). In the case of the other two interaction regions 12, the phase-shifting regions 10 on both long outer sides of the interaction regions 12 have a phase in antiphase. This means that a phase conflict 15 identified by an ellipsoid is present at these two interaction regions 12.

However, since the final phase allocation has not yet been effected, it is possible for a phase conflict to occur during the concluding phase assignment at the other two interaction regions 12, too; in other words, all four interaction regions may still lead to phase conflicts.

Figure 3D:
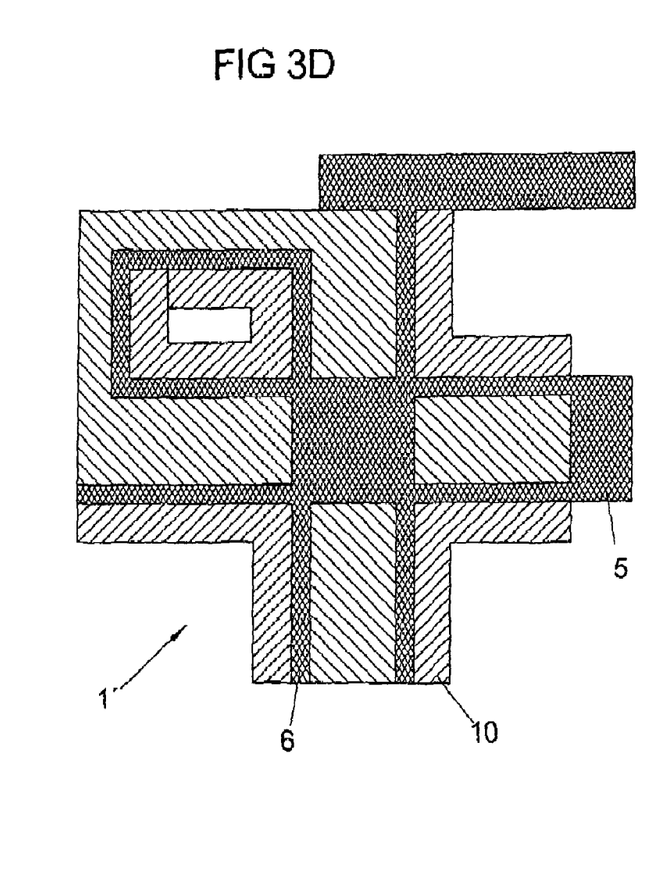

FIG. 3D shows a phase mask 1', which emerged from the phase mask of FIG. 3C by virtue of phase shifter corrections having been performed: the phase-shifting regions 10 at the long outer edges of an interaction region 12 were merged to form a contiguous phase-shifting region 10 and the phase-shifting regions 10 were assigned a final phase.

The phase mask 1' has no conflict center, this being revealed by a check for conflict centers. In this example, the contour in the center of FIG. 3D adjoins eight (that is to say an even number) critical structures, for which reason a correct phase assignment can be effected. The number of conflict centers is determined by the method described in the introduction in the prior art. The phase mask is no longer processed further analogously to FIG. 1E, since the semiconductor circuit can already be subjected to lithography in a manner free of phase conflict using the phase mask 1'. All of the phase shifter corrections performed remain on the phase mask.

Figure 4A:
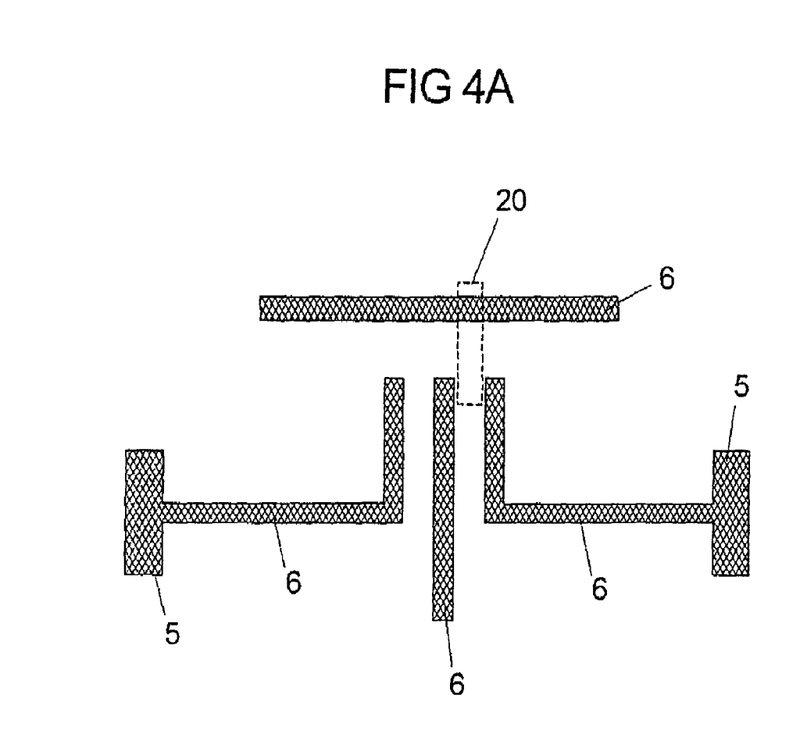
FIGS. 4A–4E show a schematic illustration of the layout of a third semiconductor circuit with associated phase masks in bright field technology.

FIG. 4A shows a schematic illustration of a third example of a layout of a semiconductor circuit as a semiconductor circuit element. The line structures 5 of the semiconductor circuit that are to be represented are again shown dark. A forbidden zone 20 is illustrated by a rectangle depicted by dashed lines. The line structures 5 which are made smaller than a critical resolution limit represent critical structures 6.

Figure 4B:
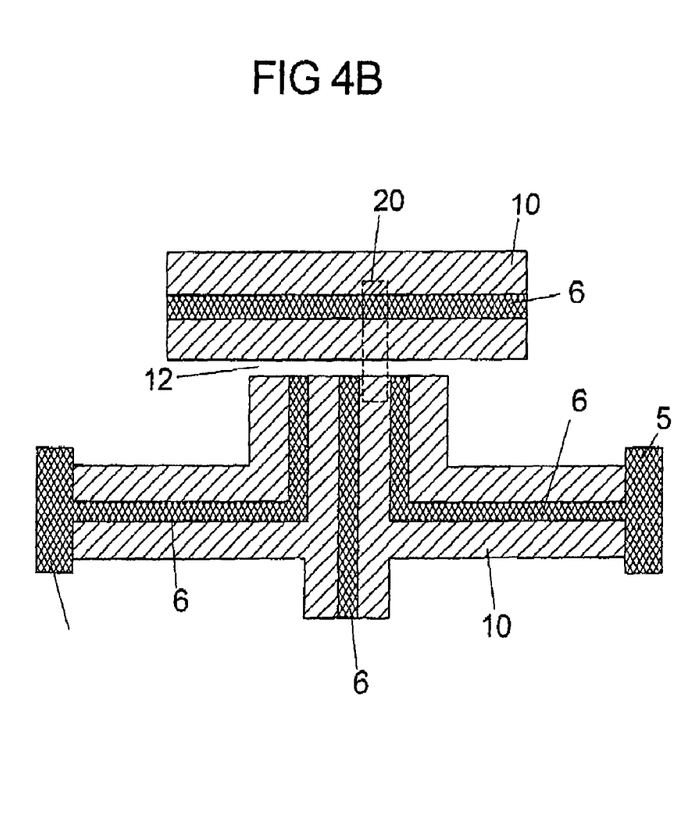

FIG. 4B shows how respective phase-shifting regions 10 are created (illustrated in hatched fashion) on both sides of the critical structures 6. A narrow interaction region 12 arises in this case. A phase-shifting region 10 is situated uniformly on one long outer side of the interaction region 12. Three ends of critical structures 6 and the four phase-shifting regions 10 surrounding them are situated on the opposite side. In this case, the forbidden zone 20 is formed such that it overlaps the interaction region 12.

Figure 4C:
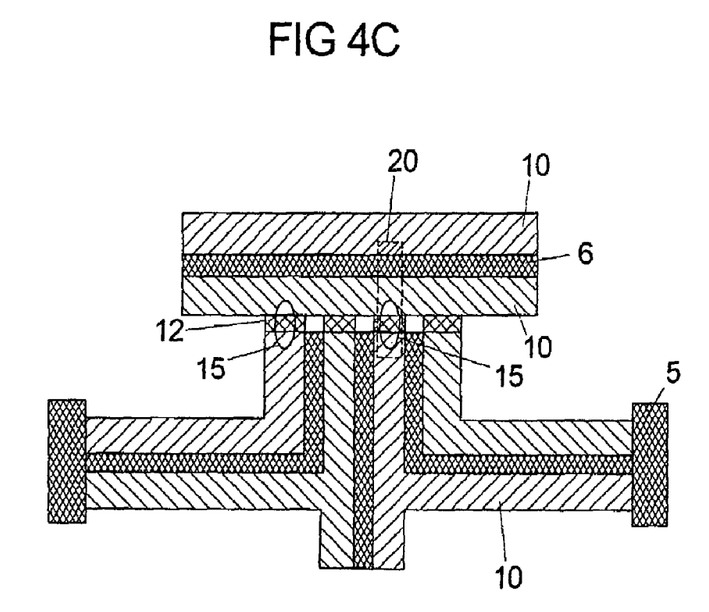

In FIG. 4C, the phase-shifting regions 10 are formed in alternating fashion for illustration purposes. Generated phase-shifting regions 10 are illustrated on both sides of the conductor structures 5, which regions have the two different phases with the phase difference of 180° and are accordingly identified by two different hatchings.

The four alternating phase-shifting regions 10 that surround the three ends of critical structures 6 are then situated on one long outer side of the interaction region 12. A phase-shifting region 10 with a uniform phase is formed on the opposite side. The consequence of this is that the phase-shifting regions 10 lead to a destructive phase conflict 15 at two locations of the interaction region 12. One of the phase conflicts 15 is formed in the forbidden zone 20.

Figure 4D:
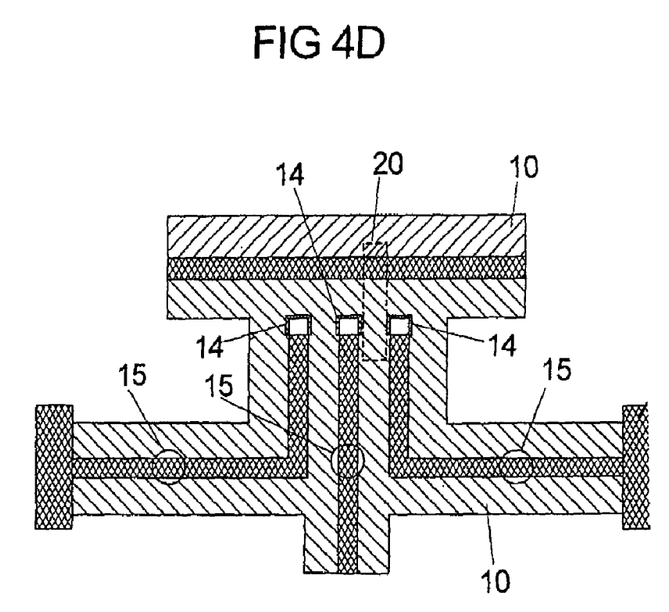

FIG. 4D shows a phase mask that emerged from the phase mask of FIG. 4C by virtue of phase shifter corrections having been performed: phase-shifting regions 10 at long outer edges of the interaction region 12 were joined together to form a contiguous phase-shifting region 10.

This results in three classical phase conflicts 15, identified by ellipsoids.

The conflict centers 14 cause the phase conflicts 15. The conflict centers 14 represent contours of contiguous regions, which adjoin a single (that is to say an odd number) critical structure 6, for which reason a conflict-free phase allocation cannot be effected. The conflict centers are illustrated by thick black contours at the three ends of the critical structures 6.

Figure 4E:
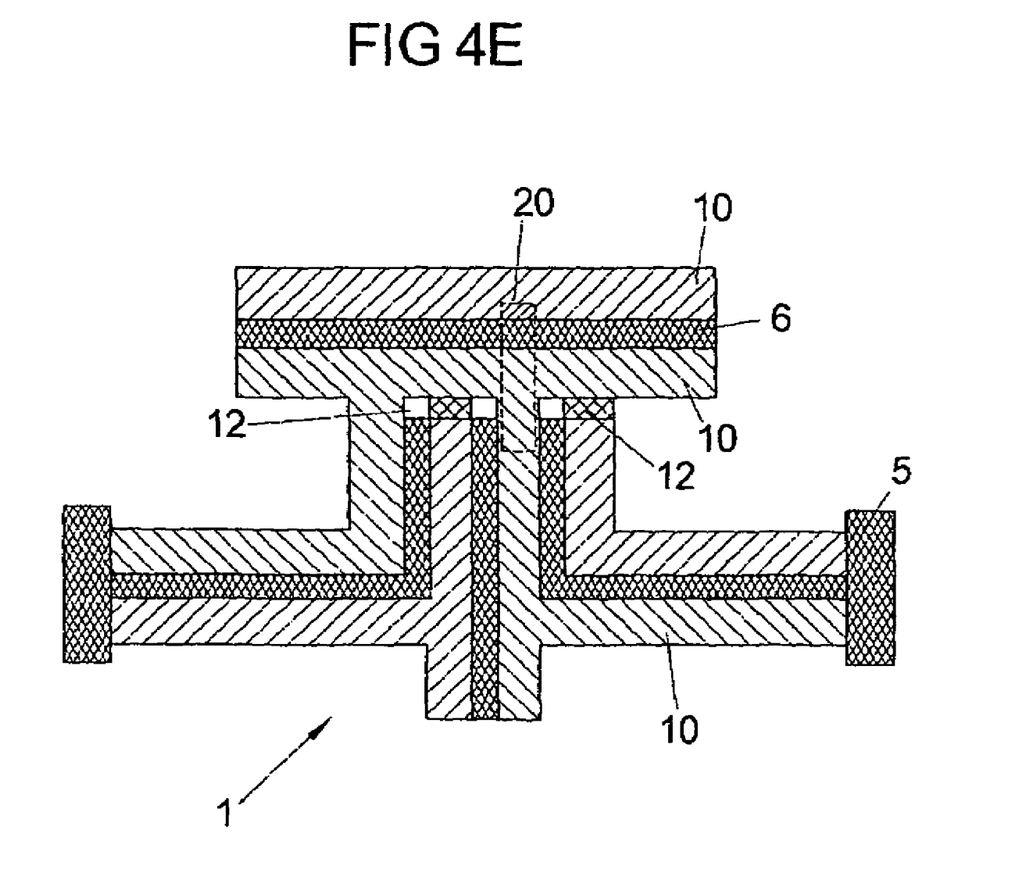

FIG. 4E shows the phase mask 1″ for the actual exposure operation. To create it, the conflict centers 14 from FIG. 4D are connected by free connecting paths such that each conflict center 14 is combined either with another conflict center 14 or with the outer contour of a contiguous region comprising phase-shifting regions 10 and critical structures 6. Since there are a multiplicity of such possible connecting paths, those connecting paths which correlate with the forbidden zone 20 are ruled out.

The result, the phase mask 1″, is a combinatorially conformal extension of the original set of phase-shifting regions 10 of uniform width and phase corrections to be treated further outside the forbidden zone 20.

Connecting paths are created during the separation of the phase-shifting region 10. Depending on the construction of the semiconductor circuit, these connecting paths might appear very complex and run through inner free contours which do not represent conflict centers. The connecting paths may be created by one or more stencil element(s) provided from a previously defined set of stencil elements with connecting paths for known layout stipulations.

The phase shifter corrections carried out previously may be used as a possible set of stencil elements. Overall, four phase shifter corrections were performed in order to create the phase mask of FIG. 4D from the phase mask of FIG. 4C. These four phase corrections represent a set of possible stencil elements, which represent possible connecting paths. That phase shifter correction which correlates with the forbidden zone 20 was excluded from this set of stencil elements. From the three remaining stencil elements, those were then selected which either respectively connect two conflict centers 14 to one another or respectively connect a conflict center 14 to an outer contour, which led to the phase mask of FIG. 4E.

The two remaining interaction regions 12 may then either be provided with an intermediate phase, or the dark locations imaged erroneously after an exposure operation are subjected to further treatment with trimming masks.

Figure 5:
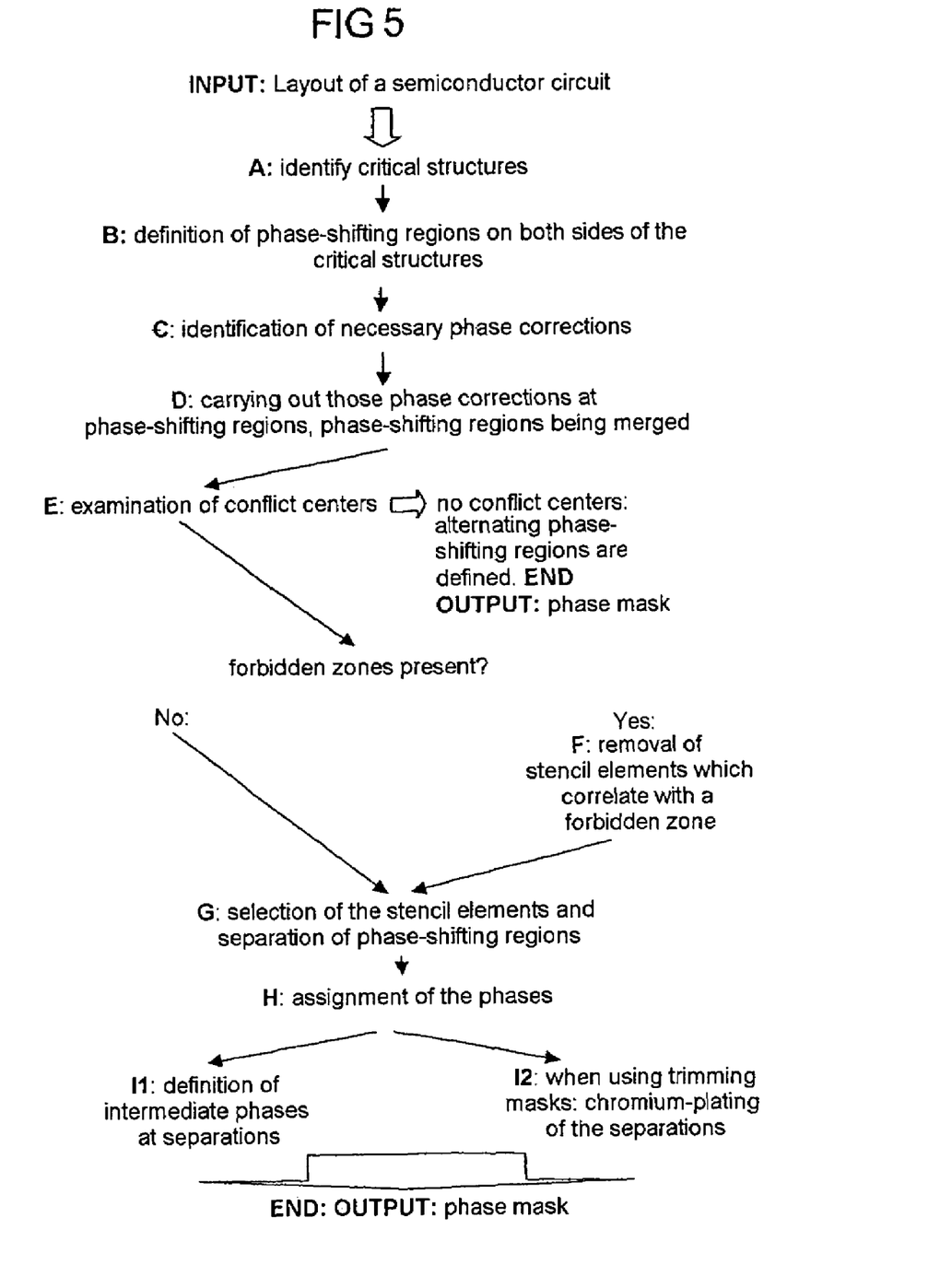
FIG. 5 shows a schematic structogram of a generation program for creating a phase mask.

FIG. 5 shows a schematic structogram of a generation program for creating a bright field or dark field phase mask, or else a chromiumless phase mask. It illustrates the sequence of the individual steps for creating a bright field phase mask as may be used by a computer program.

The layout of the semiconductor circuit to be produced serves as input (analogously to FIGS. 1A, 3A, 4A). Forbidden zones that are possibly present are likewise input and stored in the process.

On the basis of this layout, in step A, the critical structures of the circuit elements are identified and stored. The structures are identified from the fact that their spatial extent lies below an extent limit determined by the wavelength.

In step B, phase-shifting regions are defined on both sides of the critical structures (analogously to FIGS. 1B, 3B, 4B). If phase-shifting regions overlap in this case, then they are joined together to form a contiguous phase-shifting region. The phase-shifting regions may for example have a constant width, which is determined beforehand by an optical simulation program, or, alternatively, in each case have widths that are individually adapted to the critical structures.

Afterward, in step C, the necessary phase corrections are identified, for example interaction regions on the phase mask. Interaction regions are regions of the phase mask in which phase-shifting regions lie too close together. Other necessary corrections, which may result for example from phase mask boundary conditions, are also noted in this step.

In step D, phase corrections are carried out. By way of example, phase-shifting regions lying on both sides of an interaction region identified in step C are joined together. Moreover, other phase shifter corrections may be performed.

In step E, the phase mask is then examined for conflict centers present, for example by means of the method for identifying conflict centers described in the introduction. If the phase mask has no conflict centers, then the process is ended after the phase-shifting regions are assigned one of two phases shifted through 180° (analogous to FIG. 3D).

If conflict centers are present, then the generation program distinguishes at this point whether or not the semiconductor circuit to be produced has forbidden zones. If no forbidden zones are present, the program continues directly with step G. If forbidden zones are present, then the program continues with step F, followed by step G.

In step F, all those stencil elements from a set of stencil elements provided by the computer program which correlate with a forbidden zone are rejected. A stencil element contains a connecting path between two regions of the phase mask for a predetermined layout. The set of stencil elements must be comprehensive enough to assign a connecting path as far as possible to all conflict regions that occur. In the subsequent steps, interaction regions, which lead to imaging errors during an exposure operation of the phase mask, may arise along the connecting paths. This is avoided by step F. The phase shifter corrections carried out previously may particularly advantageously be used as the set of stencil elements.

Separations of phase-shifting regions are performed in step G. In this case, from a set of stencil elements (which, if appropriate, was restricted in step H), those stencil elements are selected whose connecting paths connect either two conflict centers to one another or a conflict center to an outer contour of a contiguous region. The selection of the stencil elements to be used represents a combinatorial problem, which has to be solved by the generation program. Usually, not just a single selection of possible connecting paths is possible in this case, but rather a multiplicity.

In step H, an alternating phase is assigned to the phase-shifting regions.

If intermediate phases are intended to be used, intermediate phases are assigned to the separations in step I1.

In the case where trimming masks are used for correction of dark lines the separations are chromium plated, for example, or form so-called chromiumless transitions in which the phase-shifting regions have practically no distance between one another.

The output supplied by the algorithm is a corrected phase mask whose imaging errors have been minimized or completely reduced.

Although the present invention and its advantages have been described in detail, it should be understood that various changes, substitutions and alterations can be made herein without departing from the spirit and scope of the invention as defined by the appended claims.

What is claimed is:

1. A method for creating a phase mask for lithographic exposure operations, the method comprising:
   determining locations of a plurality of critical structures, each critical structure including at least two sides;
   defining phase-shifting regions on the two sides of ones of the critical structures that fall below an extent limit; and
   carrying out at least one phase shifter correction such that at least two mutually facing phase-shifting regions, of the defined phase-shifting regions, are joined together to form a contiguous phase-shifting region if their distance from one another falls below a predetermined minimum distance.

2. The method as claimed in claim 1, and further comprising:
   after at least one phase shifter correction has been carried out, checking the phase mask for a presence of conflict centers, wherein an inner contour of a contiguous region, in which the inner contour is adjoined externally exclusively by phase-shifting regions and an odd number of critical structures, is interpreted as a conflict center; and
   eliminating at least one conflict center present by eliminating at least one phase-shifting region that adjoins the conflict center being separated into two phase-shifting regions with a different phase.

3. The method as claimed in claim 2 wherein, during the separation of at least one phase-shifting region, the phase-shifting regions that are newly formed are arranged in a manner adjoining one another.

4. The method as claimed in claim 2 wherein, during the separation of at least one phase-shifting region, the phase-shifting regions that are newly formed are arranged spaced apart, an intermediate region being covered with a light-opaque material or an intermediate region being assigned an intermediate phase.

5. The method as claimed in claim 2 wherein, after a combination of at least two phase-shifting regions or a separation of at least one phase-shifting region, phases are assigned for the phase-shifting regions in such a way as to maximize a number of phase-shifting regions with a different phase on the two sides of a critical structure.

6. The method as claimed in claim 1 wherein the at least one phase shifter correction is carried out in order that an interaction region is avoided by merging of at least two phase-shifting regions.

7. The method as claimed in claim 1 wherein the at least one phase shifter correction is carried out in order that predetermined phase mask boundary conditions are implemented.

8. The method as claimed in claim 1 wherein the at least one phase shifter correction is carried out in order that a corner of at least one phase-shifting region is made possible which has an angle other than 0°, 45°, or 90° with respect to a phase mask main direction, at which the phase mask is oriented.

9. The method as claimed in claim 1 wherein the at least one phase shifter correction is carried out in order that holes in the phase mask which cannot be realized or can only be realized in a complicated manner are prevented.

10. The method as claimed in claim 1 wherein the at least one phase shifter correction is carried out in order that phase-shifting regions at ends of critical structures are modified in order to avoid shortening effects at ends of critical structures.

11. The method as claimed in claim 1 wherein the at least one phase shifter correction is carried out in order that a separation is effected along a connecting path between at least two conflict region centers.

12. The method as claimed in claim 1 wherein a separation is effected along a connecting pat between at least one conflict center and a contour—remote from the conflict center—of the contiguous region comprising critical structures and phase-shifting regions, said contiguous region adjoining the conflict center.

13. The method as claimed in claim 1 wherein the phase mask is created by means of a computer program containing a generation program of phase-shifting regions.

14. The method as claimed in claim 1 wherein, before phase shifter corrections are carried out on the two sides of critical structures, phase-shifting regions of constant width are defined, the constant width having been determined beforehand by an optical simulation program.

15. The method as claimed in claim 1 wherein a separation of at least one phase-shifting region is effected such that a maximum number of forbidden zones containing important circuit functionalities are free of conflict regions.

16. The method as claimed in claim 1 wherein a bright field or dark field phase mask is created as the phase mask.

17. The method as claimed in claim 1 wherein a chromiumless phase mask is created as the phase mask.

18. The method as claimed in claim 1 wherein the phase-shifting regions used have precisely two different phases.

19. The method as claimed in claim 18 wherein the two phases are shifted by 180' relative to one another.

20. The method as claimed in claim 1 wherein a separation is effected along a connecting path which is determined by at least one stencil element from a previously defined set of stencil elements with connecting paths for predetermined layout stipulations.

21. The method as claimed in claim 20 wherein, prior to selection of the stencil element or stencil elements to be used, the stencil elements from the previously defined set of stencil elements that lie in a forbidden zone are rejected.

22. The method as claimed in claim 20 wherein the phase shifter corrections performed are used as stencil elements.

23. The method as claimed in claim 20 wherein a number of stencil elements used for creating separations is minimized.

24. A method of using of a phase mask produced according to the method of claim 1, the method of using comprising using the mask to produce a portion of a semiconductor circuit.

25. The method of using of claim 24 wherein undesirable imperfections that have arisen after an exposure operation carried out with the phase mask are subjected to further treatment with trimming masks.

* * * * *

UNITED STATES PATENT AND TRADEMARK OFFICE
CERTIFICATE OF CORRECTION

PATENT NO. : 7,143,390 B2 Page 1 of 1
APPLICATION NO. : 10/881703
DATED : November 28, 2006
INVENTOR(S) : Moukara It is certified that error appears in the above-identified patent and that said Letters Patent is hereby corrected as shown below:

Column 14, line 55; delete "180" insert --180°--

Signed and Sealed this

Third Day of April, 2007

JON W. DUDAS
*Director of the United States Patent and Trademark Office*